United States Patent
McElroy et al.

(10) Patent No.: US 7,167,514 B2
(45) Date of Patent: Jan. 23, 2007

(54) PROCESSING OF QUINARY DATA

(75) Inventors: Ciaran McElroy, Dublin (IE); Philip Curran, Dublin (IE); Alberto Molina Navarro, Madrid (ES)

(73) Assignee: Agere Systems Inc., Allentown, PA (US)

(*) Notice: Subject to any disclaimer, the term of this patent is extended or adjusted under 35 U.S.C. 154(b) by 762 days.

(21) Appl. No.: 10/196,242

(22) Filed: Jul. 17, 2002

(65) Prior Publication Data
US 2003/0021340 A1 Jan. 30, 2003

Related U.S. Application Data

(60) Provisional application No. 60/305,863, filed on Jul. 18, 2001.

(51) Int. Cl.
*H03H 7/30* (2006.01)

(52) U.S. Cl. .................................. 375/229; 375/353

(58) Field of Classification Search ................. 375/229, 375/219, 353; 704/500
See application file for complete search history.

(56) References Cited

U.S. PATENT DOCUMENTS

| | | | | |
|---|---|---|---|---|
| 5,291,431 A | | 3/1994 | Ho et al. ..................... 364/760 |
| 5,479,363 A | | 12/1995 | Willson, Jr. .................. 364/724 |
| 5,623,545 A | * | 4/1997 | Childs et al. .................. 380/2 |
| 5,701,393 A | * | 12/1997 | Smith et al. ................. 704/258 |
| 5,880,985 A | * | 3/1999 | Makineni et al. ............ 708/625 |
| 5,918,062 A | * | 6/1999 | Oberman et al. ............... 712/7 |
| 6,351,570 B1 | * | 2/2002 | Kobayashi .................. 382/250 |
| 6,441,601 B1 | * | 8/2002 | Clark et al. .............. 324/76.52 |
| 6,470,374 B1 | * | 10/2002 | Jin et al. ..................... 708/700 |
| 6,601,032 B1 | * | 7/2003 | Surucu ....................... 704/500 |
| 2002/0078325 A1 | * | 6/2002 | Kawasaki et al. .......... 712/210 |

FOREIGN PATENT DOCUMENTS

| | | |
|---|---|---|
| EP | 0277392 A1 | 8/1988 |
| EP | 0911967 | 4/1999 |
| WO | WO01/43285 | 6/2001 |

OTHER PUBLICATIONS

A class of high-precision multiplier-free FIR filter realizations with periodically time-varying coefficients, IEEE Transactions on signal processing, vol. 43, No. 4, Apr. 1995.*
Binary Integer Arithmetic http://www.inf.uni-konstanz.de/dbis/teaching/ws0304/computing-systems/download/rs-04.pdf.*
Li et al, IEEE Trans on Signal Processing, vol. 45, No. 4, pp. 880-890, Multiplier-Free Realizations for FIR Multirate . . . .

* cited by examiner

*Primary Examiner*—Mohammed Ghayour
*Assistant Examiner*—Leila Malek
(74) *Attorney, Agent, or Firm*—Jacobson Holman PLLC

(57) ABSTRACT

A FIR filter in a Gigabit transceiver in which data words are represented in three bits: SIGN representing word sign, SHIFT representing requirement for a shift operation, and ZERO indicating whether the word is zero. An AND gate ANDs an input coefficient and the ZERO bit, an XOR gate XORs the SIGN bit and the output of the AND gate, and a multiplier left-shifts the coefficient using the SHIFT bit and the output of the XOR gate. The circuit has a very low gate count.

8 Claims, 3 Drawing Sheets

PROCESSING OF QUINARY DATA

This is a complete application claiming benefit of provisional 60/305,865 filed Jul. 18, 2001.

INTRODUCTION

1. Field of the Invention

The invention relates to processing of quinary data such as the PAM-5 (pulse amplitude modulation) set of +2, +1, 0, −1, −2 of the 1000BASE-T "Gigabit" standards for network communication.

2. Prior Art Discussion

An example of where such processing is required is in a Finite Impulse Response (FIR) filter for echo or near end crosstalk (NEXT) cancellation in which a replica of a transmitted signal is generated. FIG. 1 represents the generic structure of such a filter. There are "taps", each having a delay line register data_del 1-data_del N through which symbols are shifted in series. A multiplier implements data_del X * coef_Y, multiplying a coefficient coef_1-coef_N and the data. The multiplier outputs are summed to provide a sum-of-products (SOP) filter output, providing a fresh sum value output for every clock cycle.

At a high level, implementation of such a filter is quite simple. However, in practice, several requirements and difficulties present themselves, such as the following.

Precision. An ASIC implementation must represent voltages as binary words of a certain length. The length of these words and the range which they cover will affect the precision of the filtering operation as well as the area (and hence power dissipation) of the filter.

Latency. If the output of the filter is needed immediately then the entire filtering operation is needed in one clock cycle (assuming the filter is clocked at the symbol rate). Therefore all the logical operations need to be carried out in this clock cycle so a fast implementation will be required. Fast implementations normally involve some degree of parallelisation and hence consume more area and power. Normally however the output of the filter is not required immediately and the filter output can be generated over several clock cycles. In this case it is often possible to use a slower design with less parallelisation and hence the filter will consume less area and power.

Technology & Library. The range of logical gates available to the implementer is a function of the technology in which the ASIC is to be implemented and the cells (gate macros) available in the library for that process. For example certain cell macros exist such as full adders and half adders which are often more efficient in digital filters than logically equivalent blocks constructed from more basic logic blocks.

Layout. The place and route tools which are employed to position logical gates on the silicon substrate work more efficiently when applied to designs that replicate a simple structure many times over. This often leads to a design that occupies less area and consumes less power.

In a typical prior approach to implementation of a FIR for quinary data, as described in EP0911967 (T.I) two's complement is used for the multiplier. Such an approach provides a relatively high gate count, and there is consumption of relatively high power, in proportion to the gate count.

The invention is directed towards providing a circuit and method for processing the data to address the above requirements.

SUMMARY OF THE INVENTION

According to the invention, there is provided a communication circuit comprising means for receiving a PAM-5 quinary data word in which a binary bit represents each of a word sign, requirement for a shift operation, and whether the word is zero.

In one embodiment, the circuit comprises a multiplier in which there is an AND gate for ANDing an input signal and the zero-representing bit.

In another embodiment, the multiplier further comprises an XOR gate for performing an XOR operation with the sign-representing bit and an input signal to negate the coefficient if it is non-zero.

In a further embodiment, the multiplier further comprises a multiplexer for left-shifting the coefficient using the shift-representing bit and the output of the XOR gate.

In one embodiment, the multiplier further comprises means for correcting a least significant bit (LSB) of the product where the data is negative.

In another embodiment, said correction means is in a sum-of-products block for a set of multipliers.

In a further embodiment, the AND gate is connected to AND a multiplier and the zero-representing bit, the XOR gate is connected for performing an XOR operation with the sign-representing bit and the output of the AND gate, and the multiplexer is connected for left shifting the coefficient using the shift-representing bit and the output of the XOR gate.

According to another aspect, the invention provides a finite impulse response (FIR) filter comprising a tap delay line; a plurality of multipliers (1), wherein each multiplier comprises means for receiving a PAM-5 quinary data word in which a binary bit represents each of a word sign, requirement for a shift operation, and whether the word is zero; and an SOP block, and in which each multiplier comprises:
- AND gates, each for ANDing an input coefficient and a zero-representing bit,
- XOR gates, each for performing an XOR operation with the sign-representing bit and an input signal to negate the coefficient if it is zero, and
- a multiplexer for left-shifting the coefficient using the shift-representing bit and the output of the XOR gate.

In one embodiment, the filter further comprises a correction circuit comprising means for maintaining a count of the sum of all sign values in the tap delay line, and means in the SOP block for adding said count to the sum.

In another embodiment, the correction circuit comprises means for maintaining said count by monitoring only the sign values of the first and the last tap delay line registers.

DETAILED DESCRIPTION OF THE INVENTION

Brief Description of the Drawings

The invention will be more clearly understood from the following description of some embodiments thereof, given by way of example only with reference to the accompanying drawings in which.

FIG. A is prior art.

In a FIR filter of the present invention, the quinary symbols are represented as set out in the table below. The representation is called Sign Shift Zero (SSZ) in this specification.

| Pam-5 Value | Sign Shift Zero |
|---|---|
| +2 | 011 |
| +1 | 001 |
| 0  | 000 |
| −1 | 101 |
| −2 | 111 |

The most significant bit (MSB) indicates sign and is zero for positive numbers and one for negative numbers. The middle bit represents a left shift operation which on 2C (twos compliment) numbers represents a multiplication by two. The least significant bit (LSB) represents the presence of the number zero and is negated so that if the number is zero the LSB is also zero; if the number is not zero then the LSB bit is one. Table 1 below shows the output of the quinary multiplier for each of the five level inputs.

TABLE 1

A truth table for the quinary multiplier without LSB correction

| Coefficient | Quinary Value | SSZ | Output |
|---|---|---|---|
| {c[4],c[3],c[2],c[1],c[0]} | +2 | 011 | {c[4],c[3],c[2],c[1],c[0],0} |
| {c[4],c[3],c[2],c[1],c[0]} | +1 | 001 | {c[4],c[4],c[3],c[2],c[1],c[0]} |
| {c[4],c[3],c[2],c[1],c[0]} | 0  | 000 | {0,0,0,0,0,0} |
| {c[4],c[3],c[2],c[1],c[0]} | −1 | 101 | {!c[4],!c[4],!c[3],!c[2], !c[1],!c[0]} |
| {c[4],c[3],c[2],c[1],c[0]} | −2 | 111 | {!c[4],!c[3],!c[2],!c[1], !c[0],1} |

In Table 1 where the quinary value is +2 the output of the multiplier is two times the input coefficients, and is shown in column 4. It can be seen that it is simply a left shift of the input coefficients with a zero appended. When the quinary value is +1 the output is equal to the input coefficients with the MSB repeated i.e. sign extended. For zero, the output is zero. Where the quinary value is −1 the output is equal to the coefficient input bits inverted and the MSB is repeated. This is equal to one less than the arithmetic negative of the input coefficients. For a quinary value of −2 the output is the input coefficient bits inverted and left shifted and a 1 is appended.

This format is more efficient than 2C since each SSZ bit can be used directly in the filter multipliers.

Figure 1:
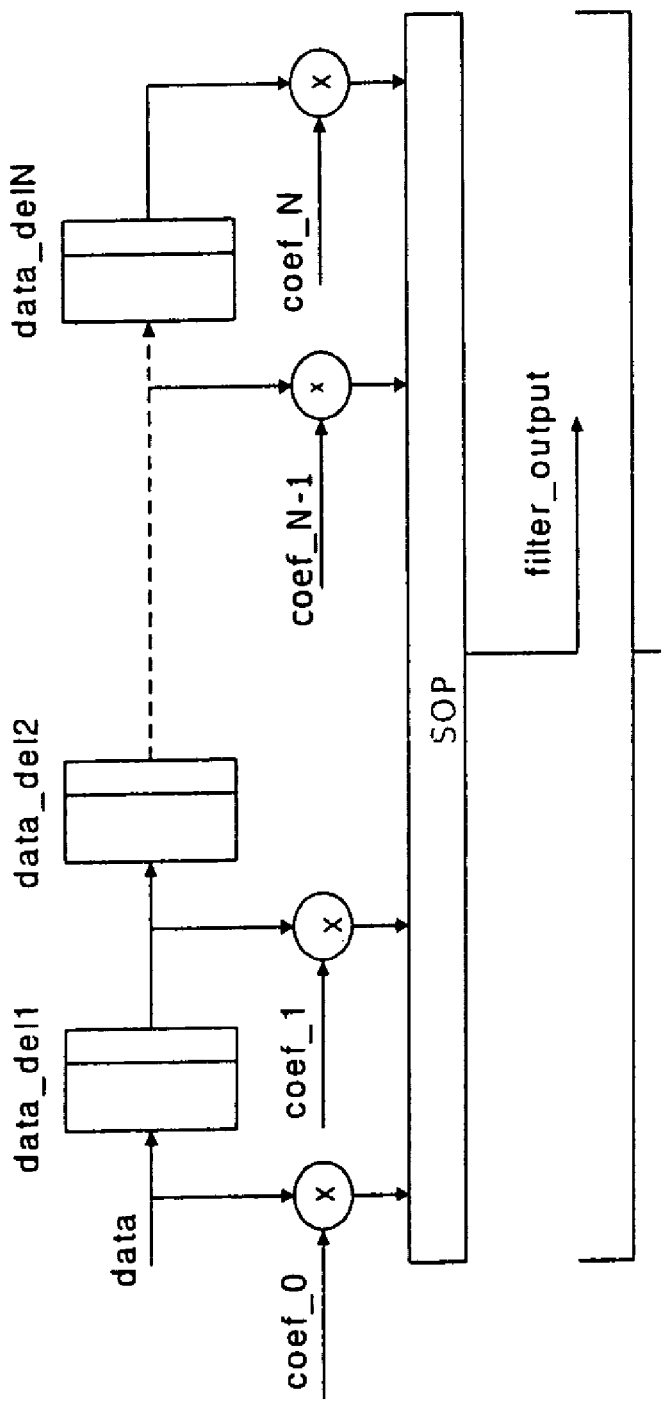
FIG. 1 is a diagram of a prior art generic structure for a filter.
Figure 2:
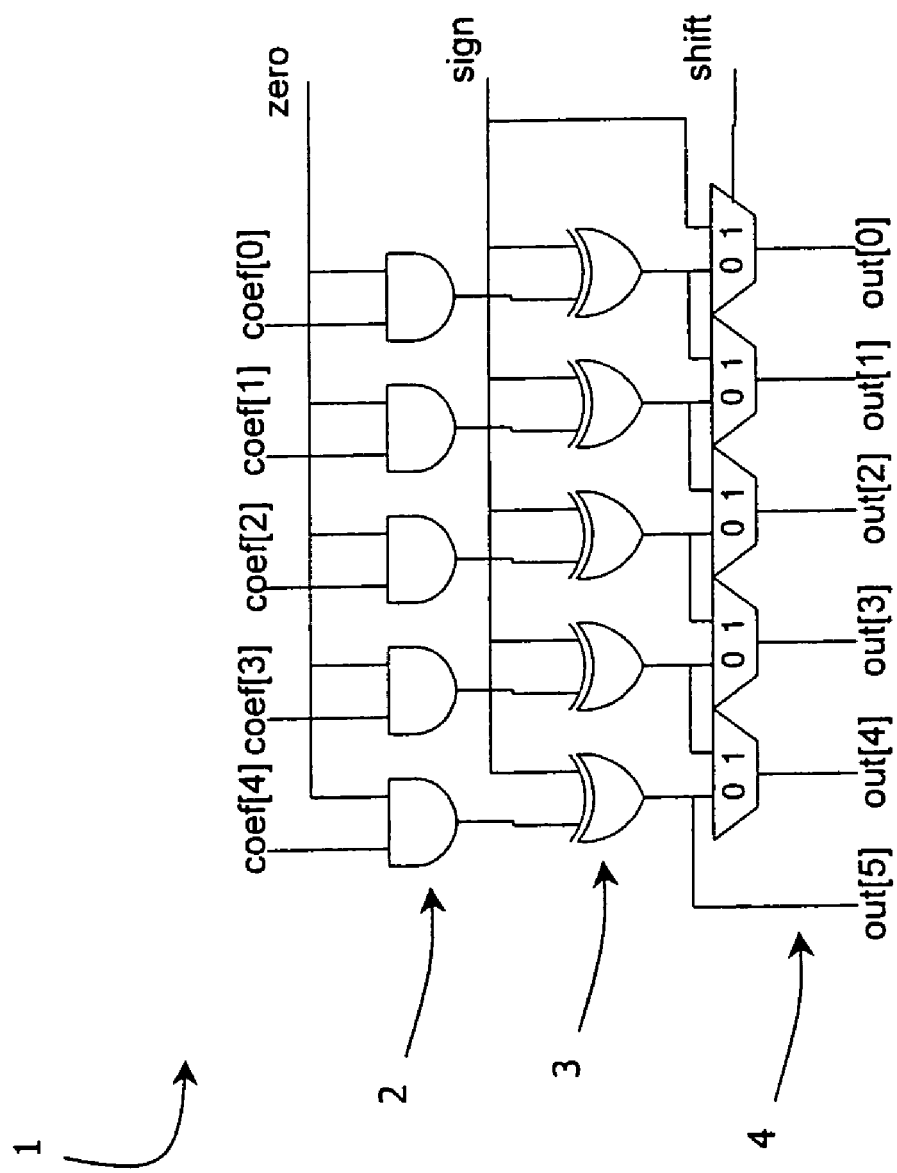
FIG. 2 is a logic circuit diagram for a 5-bit multiplier according to the present invention.

Referring to FIG. 2, a 5-bit multiplier 1 comprises five AND gates 2, five XOR gates 3, and five multiplexers 4. Only the zero-bit line is ANDed with the coefficients, the sign-bit line is XORed, and the shift-bit line is multiplexed. As shown in FIG. 2, every bit of the coefficient can be ANDed directly with the zero bit of the data. The resultant will be zero if the zero bit is zero, or unchanged if it is not. The multiplexers 4 left shift the coefficient, and the sign bit is XORed with the coefficient to negate it. The arithmetic negative of a twos complement number can be obtained by inverting each of the bits and adding 1 to the LSBs.

Therefore in an SOP connected to the multiplier 1 an addition needs to be done where X LSBs need to be added to the result. X represents the number of negative data terms in the delay line. Heretofore, this has been performed by providing an adder associated with each multiplier of the FIR filter. Such an adder adds a sign to the result of the every multiplication. Thus, for N taps there are N adders.

Figure 3:
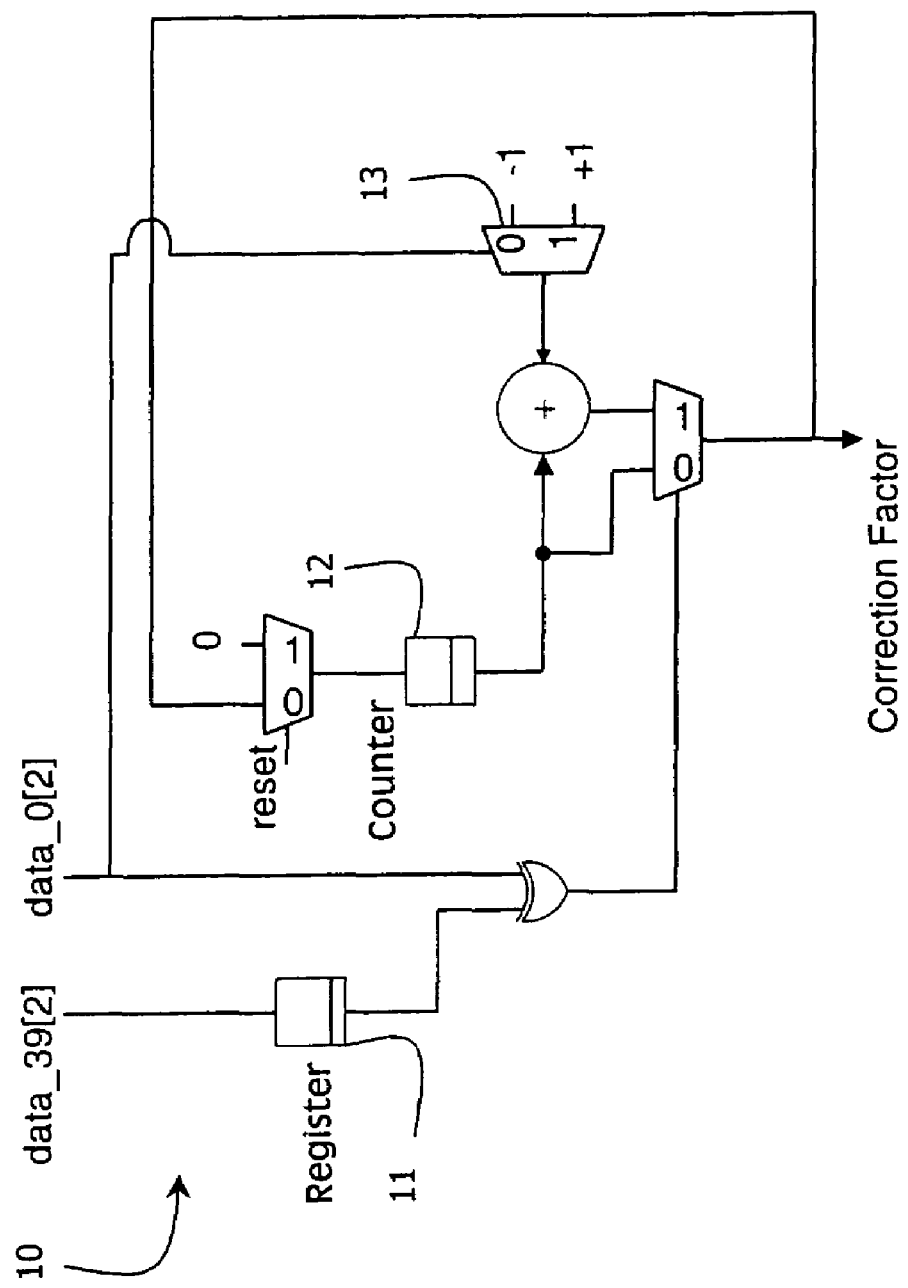
FIG. 3 is a logic circuit diagram for a correction circuit in accordance with the present invention.

However, in the invention the sign bit S is used to achieve the same effect using only one correction circuit, shown in FIG. 3 and indicated by the numeral 10. The circuit 10 resides between the inputs to the tap delay line and the SOP block of the FIR filter. Its inputs are only the first and the last register valves data_0(2) and data_39(2). The output is a single word correction factor, delivered to the SOP block.

The data_0(2) value is inputted to an XOR gate together with the data_39(2) value, the latter being delayed by a register 11. The remainder of the circuit 10 effectively maintains a count of the sum of the all sign values in the tap delay line by incrementing and decrementing a counter 12 as the sign values in the first and last tap delay line registers change. The counter is incremented and decremented as follows, in which a sign value of 1 means negative and 0 means positive.

| data_0(2) value | data_39(2) value | Correction |
|---|---|---|
| 0 | 0 | no change |
| 1 | 0 | increment |
| 0 | 1 | decrement |
| 1 | 1 | no change |

Thus, in the circuit 10, if the sign values are the same a multiplexer 13 selects the previous count value, and if different, it selects the previous value together with the correction.

The size of the counter register should be chosen so that overflow will not occur. The reset signal is used to reset the counter to zero. This is a very simple circuit relative to the overall SOP circuitry.

It will be appreciated that the multiplier 1 of FIG. 2 is very simple and can be implemented with a very low gate count. It is thus a considerable saving on a multiplier using prior representation schemes such as magnitude or 2C representations. It will also be appreciated that the overall FIR filter is considerably simpler than in prior approaches.

The invention is not limited to the embodiments described but may be varied in construction and detail. For example, multipliers of the invention could be implemented for other suitable functions in a 1000BASE-T transceiver such as a base line wander compensation circuit, a decision feedback equaliser, or a decision feedback sequence estimator. Also, the order of the operations may be different from that illustrated in FIG. 2.

The invention claimed is:

1. A communication circuit comprising a multiplier for receiving a PAM-5 quinary data word in which a binary bit represents each of a word sign, requirement for a shift operation, and whether the word is zero, said multiplier including an AND gate for ANDing an input coefficient and the zero-representing bit, and an XOR gate for performing an XOR operation with the sign-representing bit and an output of said AND gate to negate the coefficient if the coefficient is non-zero and the zero-representing bit and the sign-representing bit are both zero, or if the coefficient, the zero-representing bit and the sign-representing bit are all non-zero.

2. The communication circuit as claimed in claim 1, wherein the multiplier further comprises a multiplexer for left-shifting the coefficient using the shift-representing bit and the output of the XOR gate.

3. The communication circuit as claimed in claim 1, wherein the multiplier further comprises means for correcting a least significant bit (LSB) of the product where the data is negative.

4. The communication circuit as claimed in claim 3, wherein said correction means is in a sum-of-products block for a set of multipliers.

5. A finite impulse response (FIR) filter comprising a tap delay line; a plurality of multipliers, each multiplier configured to receive a PAM-5 quinary data word in which a binary bit represents each of a word sign, requirement for a shift operation, and whether the word is zero; and a sum-of-products (SOP) block, each multiplier including:
   AND gates, each for ANDing an input coefficient and a zero-representing bit;
   XOR gates, each for performing an XOR operation with the sign-representing bit and an output of said AND gates to negate the coefficient if the coefficient is zero and the zero-representing bit and the sign-representing bit are both non-zero; and
   a multiplexer for left-shifting the coefficient using the shift-representing bit and the output of the XOR gates.

6. The finite impulse response (FIR) filter as claimed in claim 5, wherein the filter further comprises a correction circuit comprising means for maintaining a count of the sum of all sign values in the tap delay line, and means in the SOP block for adding said count to the sum.

7. The finite impulse response (FIR) filter as claimed in claim 6, wherein the correction circuit comprises means for maintaining said count by monitoring only the sign values of the first and the last tap delay line registers.

8. A finite impulse response (FIR) filter comprising:
   a tap delay line;
   a plurality of multipliers, each multiplier configured to receive a PAM-5 quinary data word in which a binary bit represents each of a word sign, requirement for a shift operation, and whether the word is zero, each multiplier including,
   an AND gate for ANDing an input coefficient and a zero-representing bit;
   an XOR gate for performing an XOR operation with the sign-representing bit and an output of said AND gate to negate the coefficient if the coefficient, the zero-representing bit and the sign-representing bit are all zero, or if the coefficient is zero and the zero-representing bit and the sign-representing bit are both non-zero;
   a multiplexer for left-shifting the coefficient using the shift-representing bit and the output of the XOR gate; and
   a correction circuit configured to maintain a count of the sum of all sign values in the tap delay line by monitoring only the sign values of the first and the last tap delay line registers.

* * * * *